(12) United States Patent
Lin et al.

(10) Patent No.: US 9,305,993 B2
(45) Date of Patent: Apr. 5, 2016

(54) METHOD OF MANUFACTURING SEMICONDUCTOR STRUCTURE (71) Applicant: MACRONIX International Co., Ltd., Hsinchu (TW)

(72) Inventors: Chen-Yuan Lin, Hsinchu (TW);
Ching-Lin Chan, Hsinchu (TW);
Cheng-Chi Lin, Hsinchu (TW);
Shih-Chin Lien, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/591,622

(22) Filed: Jan. 7, 2015

(65) Prior Publication Data

US 2015/0118820 A1 Apr. 30, 2015

Related U.S. Application Data

(62) Division of application No. 13/905,546, filed on May 30, 2013, now Pat. No. 8,963,277.

(60) Provisional application No. 61/778,577, filed on Mar. 13, 2013.

(51) Int. Cl.
*H01L 21/8238* (2006.01)
*H01L 49/02* (2006.01)
*G05F 3/02* (2006.01)
*H01L 27/06* (2006.01)
*H01L 29/66* (2006.01)

(52) U.S. Cl.
CPC ........ *H01L 28/20* (2013.01); *G05F 3/02* (2013.01); *H01L 27/0629* (2013.01); *H01L 29/66113* (2013.01)

(58) Field of Classification Search
CPC ............ H01L 27/0629; H01L 27/0635; H01L 27/0647; H01L 27/0288–27/0296; H01L 27/0652–27/0658; H01L 27/067–27/0802; H01L 27/101; H01L 27/1112; H01L 28/20; H01L 29/7408; H01L 29/8605; H01L 51/05; H01L 2027/11842
See application file for complete search history.

(56) References Cited

U.S. PATENT DOCUMENTS

| | | | | |
|---|---|---|---|---|
| 4,212,684 A | * | 7/1980 | Brower | ............... H01L 21/033 257/380 |
| 5,355,014 A | | 10/1994 | Rao et al. | |
| 2005/0253218 A1 | | 11/2005 | Jeon et al. | |
| 2006/0290462 A1 | * | 12/2006 | Beach | ................... H01C 1/14 338/9 |
| 2012/0146105 A1 | * | 6/2012 | Banerjee | ........... H01L 27/0629 257/272 |
| 2013/0032862 A1 | | 2/2013 | Su et al. | |

OTHER PUBLICATIONS

"Office Action of Taiwan Counterpart Application," issued on Jan. 13, 2015, p. 1-p. 7.

* cited by examiner

*Primary Examiner* — David Vu
*Assistant Examiner* — Cuong Nguyen
(74) *Attorney, Agent, or Firm* — J.C. Patents (57) ABSTRACT

A method of manufacturing a semiconductor structure with a high voltage area and a low voltage area is provided. The method includes the following steps: providing a substrate of a first conductivity type; forming a second doped region of a second conductivity type in the substrate by a first implantation; forming a first doped region of a first conductivity type in the second doped region by a second implantation; forming an insulating layer on the substrate; forming a resistor on the insulating layer, wherein the resistor is electrically connecting the high voltage area and the low voltage area; and forming a conductor electrically connected to the resistor. The step of forming a first doped region defines the high voltage area and the low voltage area.

5 Claims, 15 Drawing Sheets

METHOD OF MANUFACTURING SEMICONDUCTOR STRUCTURE

CROSS-REFERENCE TO RELATED APPLICATION

This application is a divisional application of and claims the priority benefit of U.S. application Ser. No. 13/905,546, filed on May 30, 2013, now allowed. The prior U.S. application Ser. No. 13/905,546 claims the priority benefit of U.S. provisional application Ser. No. 61/778,577, filed on Mar. 13, 2013. The entirety of each of the above-mentioned patent applications is hereby incorporated by reference herein and to made a part of this specification.

FIELD OF THE INVENTION

The present invention relates in general to a semiconductor structure and more particularly to a semiconductor structure with a high voltage resistance.

BACKGROUND

High voltage integrated circuits (HVICs) translate low-voltage control signals to levels that are suitable for driving power switches in high voltage applications. HVICs can also translate signals from higher voltage levels to lower voltage levels in a single chip with high voltage and low voltage circuits, sharing the same I/O pad. As such, voltage isolation must be carefully managed to prevent the low voltage circuit from permanent damages caused by high stress. One of the HVIC designs is to integrate a high voltage resistor in the semiconductor structure for the sake of reducing the level of high input voltage before it enters into the low voltage circuit. Poly-silicon is frequently used in the existing manufacturing process, and the appropriate resistance for a specific application can be tuned by the doping concentration and the total length and pattern of the poly-silicon resistor.

In the case of when a high voltage surge occurs to the I/O pad of the HVIC, the poly-silicon resistor itself can be damaged by the high stress, and the low voltage circuit would be unavoidably impacted due to the lack of stress reduction. The conventional HVIC structure utilizing a poly-silicon resistor may also include an inherent capacitor using the poly-silicon resistor as one electrode and the substrate connecting to ground as another. The built-in capacitor is designed to shunt the high to stress when the high voltage surge exceeds the breakdown voltage of said capacitor. In this case, the poly-silicon resistor can be protected from high voltage burn out.

To permit a higher input voltage applied to the HVIC, a circuit that is allowed to hold a greater breakdown voltage is desired in order to facilitate the function of voltage isolation. The circuit shall be suitable for a specific high voltage application with a structure that properly shunts the high voltage surge and allows the structure to withstand a higher breakdown voltage.

SUMMARY OF THE INVENTION

The objective of the present invention is to provide a suitable semiconductor structure for a specific high voltage application, in which said semiconductor structure properly shunts the high voltage surge before said high stress damages the high voltage resistor in the conventional structure, and allows the semiconductor structure to withstand a higher breakdown voltage. A guard path including a capacitor and a diode having a high breakdown voltage is devised in said structure in order to achieve the objective. An extended depletion region is formed to attenuate a high electric field that especially occurs at the region with a non-continuous doping profile. A depletion-assisting layer is demonstrated to increase the depletion width and extend the region occupied by space charges. Electric field distribution is altered in the semiconductor structure presented in the present invention such that an avalanche breakdown would occur at a higher voltage.

One embodiment of the present invention is to provide a semiconductor structure with a high voltage area and a low voltage area, including a substrate of a first conductivity type accommodating the high voltage area and the low voltage area; a resistor on the substrate, connecting the high voltage area and the low voltage area, wherein the resistor is configured to reduce bias applied to the high voltage area, and the resistor resides substantially in the high voltage area; a first doped region of a first conductivity type in the substrate between the high voltage area and the low voltage area; a second doped region of a second conductivity type between the substrate and the first doped region; and an insulating layer between the resistor and the first doped region. Another embodiment, similar to the above, further comprises a third doped region of the second conductivity type between the insulating layer and the first doped region.

Another embodiment of the present invention is to provide a method of manufacturing a semiconductor structure with a high voltage area and a low voltage area, in which said method includes the following steps: providing a substrate of a first conductivity type; forming a second doped region of a second conductivity type in the substrate by a first implantation; forming a first doped region of a first conductivity type in the second doped region by a second implantation; forming an insulating layer on the substrate; forming a resistor on the insulating layer, wherein the resistor is electrically connecting the high voltage area and the low voltage area; and forming a conductor electrically connected to the resistor. The step of forming a first doped region defines the high voltage area and the low voltage area.

Another embodiment of the present invention is to provide a semiconductor structure with a high voltage area and a low voltage area, including a substrate of a first conductivity type; a doped region of a second conductivity type in the substrate; a diode device in the doped region, wherein the diode device comprises a first end of a first conductivity type and a second end of a second conductivity type; an insulating layer on the substrate; a resistor on the insulating layer, electrically connecting a high voltage input of the high voltage area and the low voltage area; and a capacitor comprising a third end connecting to the resistor and a fourth end connecting to the second end of the diode device.

BRIEF DESCRIPTION OF THE DRAWINGS

The invention will be described according to the appended drawings in which:

FIG. 8A to FIG. 8J illustrate manufacturing steps of a method of manufacturing a semiconductor structure with a cross-sectional view illustrated as in FIG. 4.

DETAILED DESCRIPTION OF THE INVENTION

The embodiments of the present invention are described more fully hereinafter with reference to the accompanying drawings, which form a part hereof, and which show, by way of illustration, specific exemplary embodiments by which the invention may be practiced. This invention may, however, be embodied in many different forms and should not be construed as limited to the embodiments set forth herein; rather, these embodiments are provided so that this disclosure will be thorough and complete, and will fully convey the scope of the invention to those skilled in the art. As used herein, the term "or" is an inclusive "or" operator, and is equivalent to the term "and/or," unless the context clearly dictates otherwise. In addition, throughout the specification, the meaning of "a," "an," and "the" include plural references.

Figure 1:
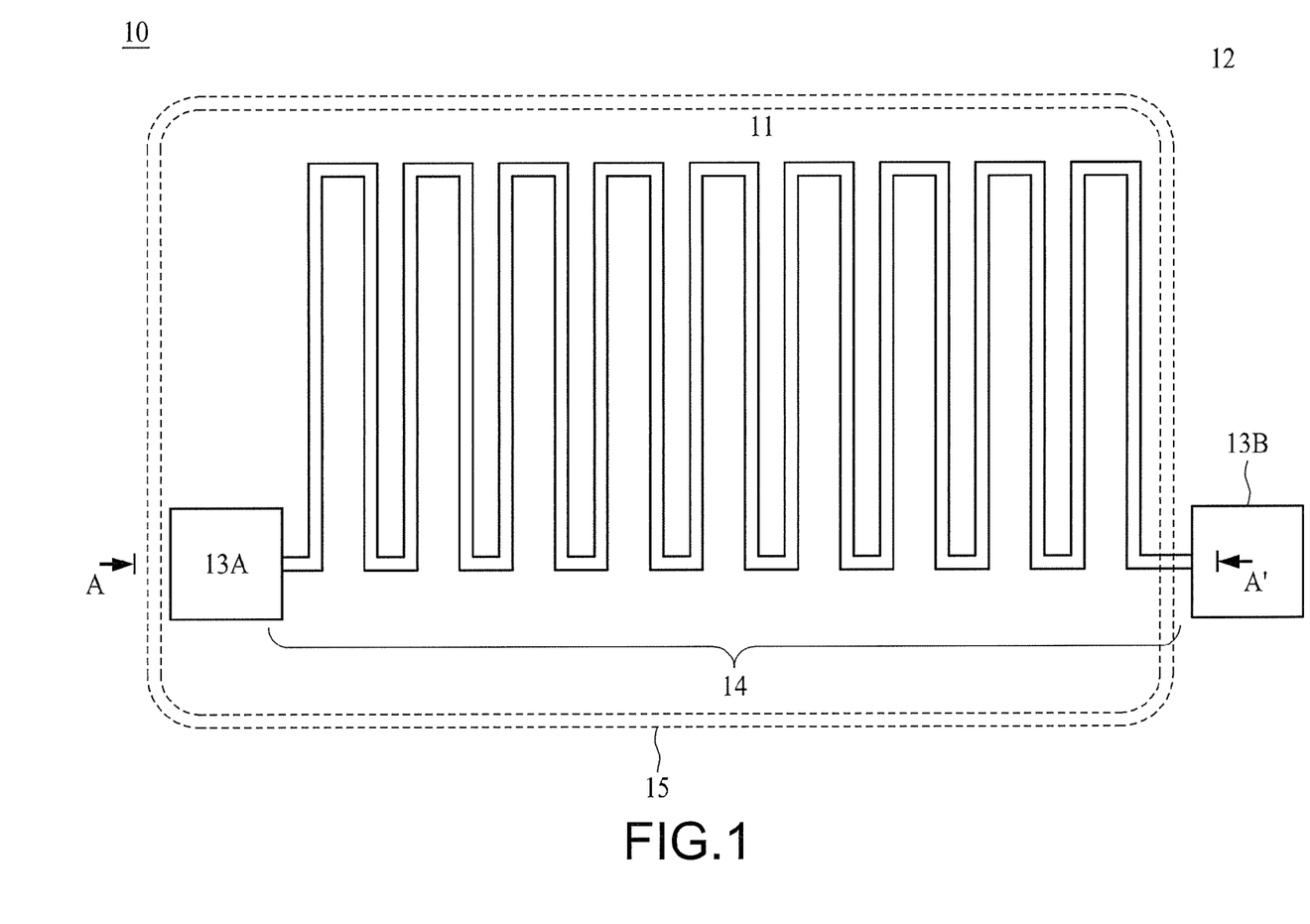
FIG. 1 depicts a top view of a semiconductor structure with a high voltage area and a low voltage area according to one embodiment of the present invention, wherein the dotted lines represent a buried portion of the structure.

One embodiment of the present invention provides a structure depicted in FIG. 1. Shown in FIG. 1 is a top view of a semiconductor structure 10 with a high voltage area 11 and a low voltage area 12. The illustration shown in dotted lines represents a portion buried in the substrate of the semiconductor structure 10. An input pad 13A electrically connects to a resistor 14. In the present embodiment, the resistor 14 is patterned in a meandering fashion to obtain sufficient resistance. One end of the resistor 14 electrically connects to the input pad 13A, and the other end thereof extends from the high voltage area 11 to the low voltage area 12, connecting to the output pad 13B. A depletion-assisting layer 15 (hereinafter "assisting layer") is a buried portion in the substrate of the semiconductor structure 10. The position of the assisting layer 15 separates the high voltage area 11 from the low voltage area 12. In other words, any high voltage stress sufficient enough to deteriorate the function or structural integrity of the low voltage area 12 will be guarded by the assisting layer 15. The illustration of FIG. 1 omits other structures on the surface of the semiconductor structure 10 in order to highlight the buried portion.

Figure 2:
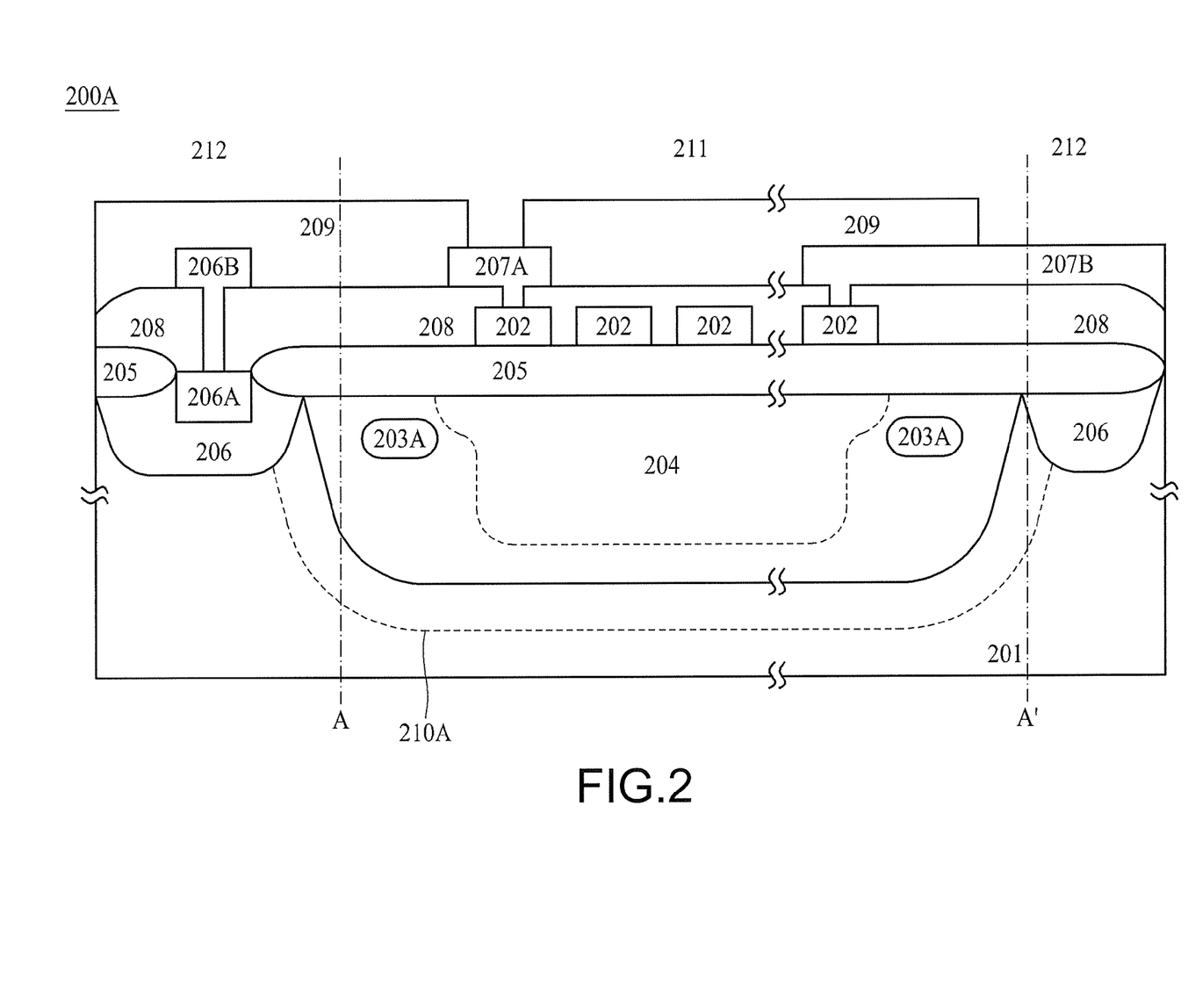
FIG. 2 depicts a cross-sectional view along line AA' shown in FIG. 1 according to one embodiment of the present invention.

FIG. 2 depicts a cross-sectional view 200A along line AA' of FIG. 1. The cross-section of the semiconductor structure with a high voltage area 211 and a low voltage area 212 includes a high resistance P-type substrate 201 accommodating the high voltage area 211 and the low voltage area 212. Referring back to FIG. 1, the cross-section shown in FIG. 2 mainly depicts the structural profile of the high voltage area 11 and the assisting layer 15. The resistor 202 in FIG. 2 corresponds to the resistor 14 shown in FIG. 1. The input pad 207A and the output pad 207B in FIG. 2 correspond to the input pad 13A and the output pad 13B shown in FIG. 1. The P-doped region 203A corresponds to the assisting layer 15 shown in FIG. 1. The resistor 202 of FIG. 2 connects the high voltage area 211 and the low voltage area 212, wherein the resistor 202 is configured to reduce bias applied to the high voltage area 211 through an input pad 207A, and the resistor 202 resides substantially in the high voltage area 211. A P-doped region 203A is positioned in an N-well 204 in the substrate 201. As shown in FIG. 1 and FIG. 2, the P-doped region 203A forms the assisting layer 15 separating the high voltage area (11, 211) from the low voltage area (12, 212). Hence, one of the P-doped regions 203A is shown at the left corner of the N-well 204 and another P-doped region 203A is shown at the right corner of the N-well 204. An insulating layer 205 is positioned on the surface of the substrate 201 and between the resistor 202 and the P-doped region 203A.

The cross-sectional semiconductor structure 200A in FIG. 2 further includes a P-well 206 surrounding the N-well 204. An ohmic contact 206A of the P-well 206 connects the substrate 201 to a metal contact 206B, which can be further grounded. Due to the meandering pattern of the resistor 14 shown in FIG. 1, a plurality of resistor segments can be seen from the cross-sectional view of the structure 200A. An interlayer dielectric 208 is deposited on and between the patterned resistor 202. Current is allowed to flow from the contact input 207A, through the resistor 202, and exits the high voltage area 211 from an output contact 207B. In one embodiment, the contact input 207A can be the I/O pad of the high voltage circuits devised in the high voltage area 211. A passivation layer 209 can be finally covered on the top of the device, and a portion of the input pad 207A is exposed from the passivation layer 209.

In FIG. 2, the range of a depletion region 210A is defined by dotted lines. Compared to a structure without a P-doped region 203A, the depletion region 210A in the structure 200A is extended, therefore creating a greater space charge region and the intensity of the electric field can be effectively reduced in the structure 200A. A milder gradient of the electrical potential is allowed to sustain a higher breakdown voltage, and the structure 200A is then suitable for high voltage applications.

In one embodiment, the highly resistive P-doped substrate 201 has a resistance of between 50 and 200 ohm. The doping concentration of the N-well 204 is lower than the P-doped region 203A. For example, the doping concentration of the N-well 204 can be from $2 \times 10^{12}$ to $3 \times 10^{12}/cm^2$, and that of the P-doped region 203A can be from $5 \times 10^{12}$ to $9 \times 10^{12}/cm^2$.

The insulating layer of the structure 200A shown in FIG. 2 can be composed of field oxide or shallow trench isolation. The resistor 202 of the same structure 200A can be composed of the following conductive materials: poly-silicon, aluminum, copper, silicon carbide, titanium nitride, or the combination thereof. The resistance of the conductive materials can be controlled through ion implantation or the geometry thereof.

In one embodiment, the P-doped region 203A shown in the structure 200A is buried in the P-substrate 201; however, the position of the P-doped region 203A can be elevated toward the surface of the P-substrate 201. In other words, the insulating layer 205 can be placed between the resistor 202 and the N-well 204, as shown in FIG. 2, or can be placed between the resistor 202 and the P-doped region 203A (not shown).

Figure 3:
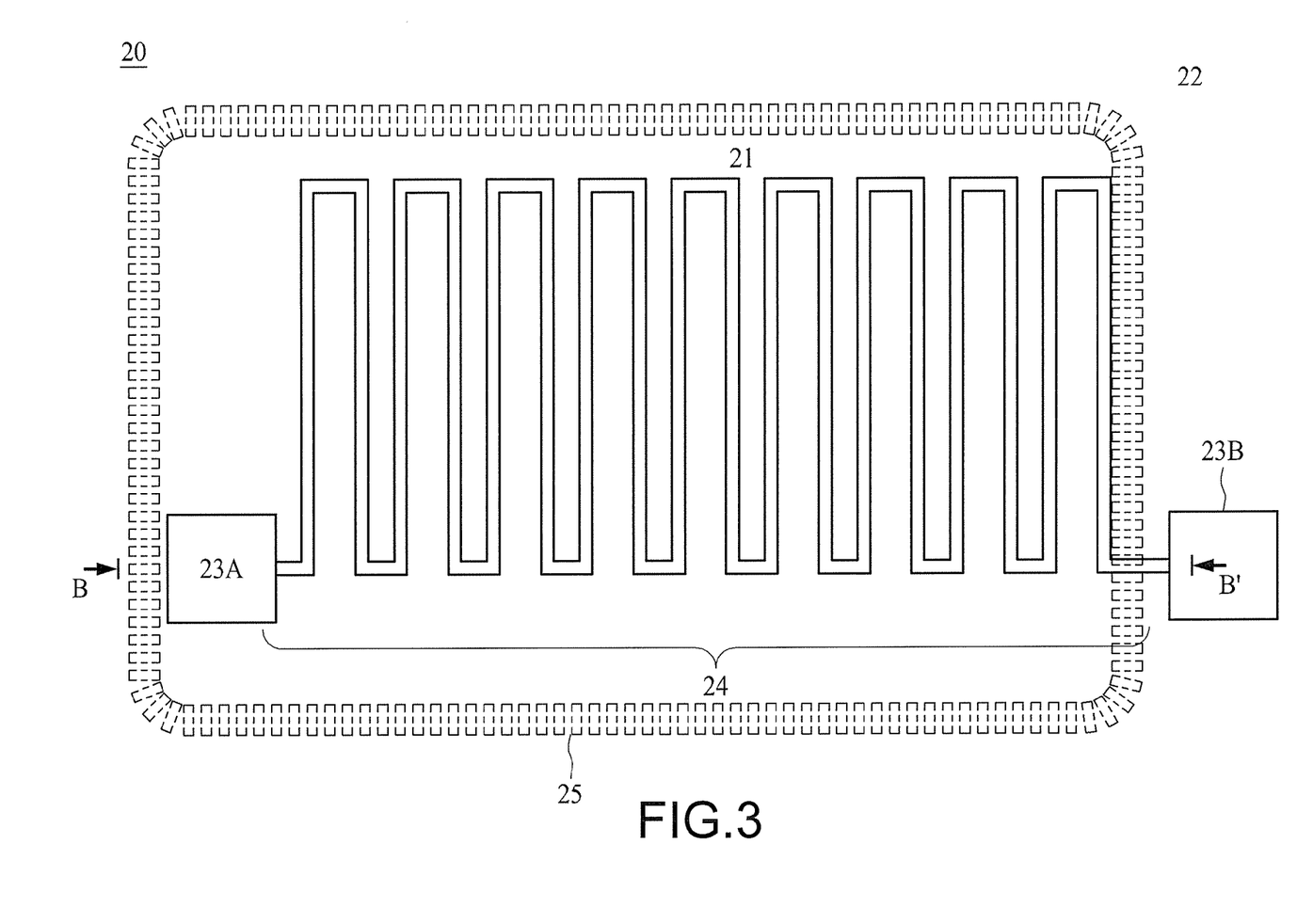
FIG. 3 depicts a top view of a semiconductor structure with a high voltage area and a low voltage area according to one embodiment of the present invention, wherein the dotted lines represent a buried portion of the structure.

FIG. 3 depicts a top view of a semiconductor structure 20 with a high voltage area 21 and a low voltage area 22 according to one embodiment of the present invention. The illustration shown in dotted lines represents a portion buried in the substrate of the semiconductor the structure 20. The input pad 23A, the output pad 23B, and the resistor 24 shown in FIG. 3 can be similar structures as shown in FIG. 1; however, the assisting layer 25 of the structure 20 demonstrates a non-continuous layout viewing from the top, whereas the assisting layer 15 in FIG. 1 shows a continuous layout. The non-continuous assisting layer 25 creates a lateral depletion region and is therefore preferred when withholding a higher breakdown voltage is desired.

Figure 4:
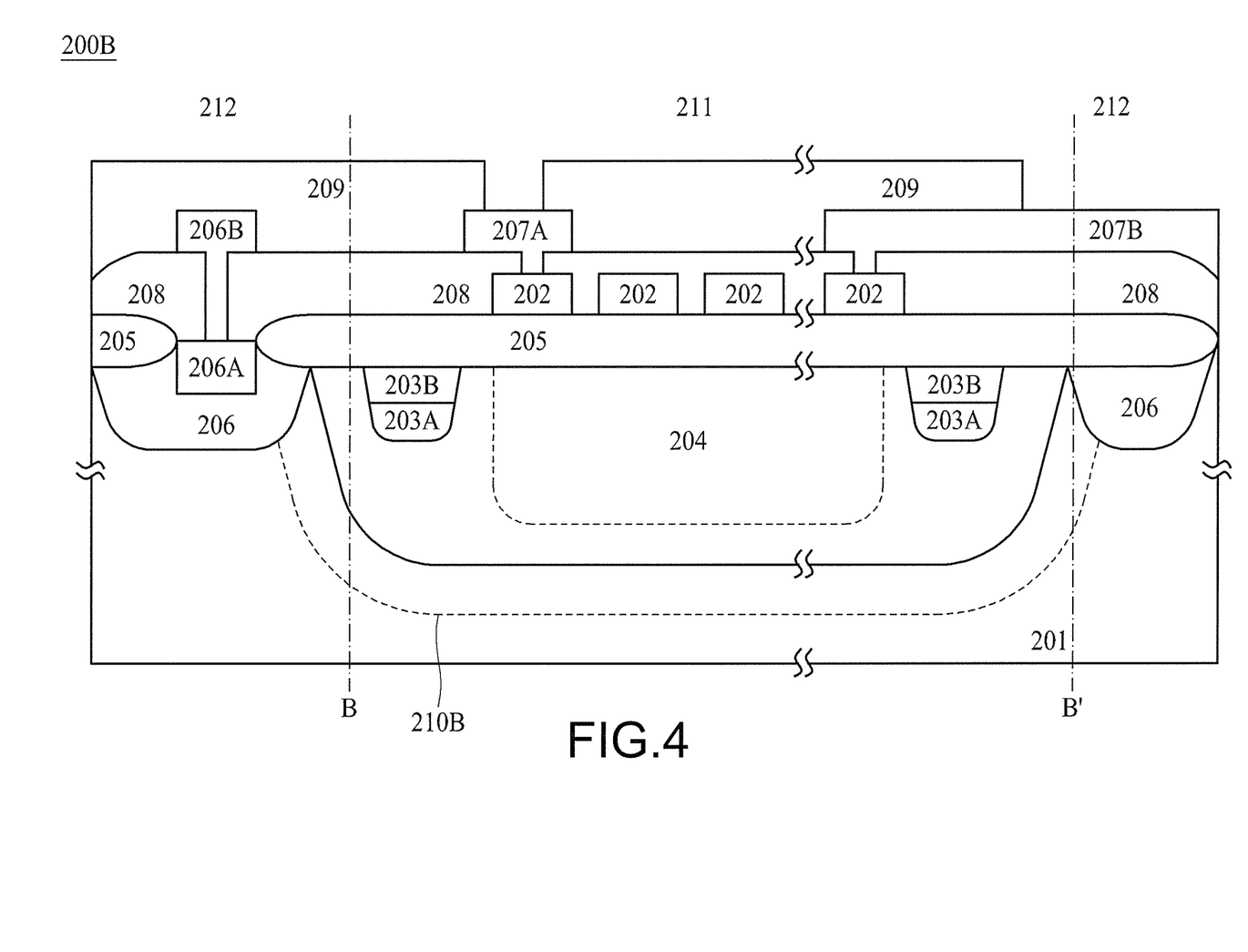
FIG. 4 depicts a cross-sectional view along line BB' shown in FIG. 3 according to another embodiment of the present invention.

The doping profile of the assisting layer 25 in semiconductor structure 20 is also different from the one in semiconductor structure 10. FIG. 4 depicts a cross-sectional view along line BB' shown in FIG. 3 according to another embodiment of the present invention. The semiconductor structure 200B shares a similar structure with the structure 200A in FIG. 2; however, the assisting layer of the structure 200B further comprises an N-doped region 203B on top of the P-doped region 203A. That is, the insulating layer 205 is between the resistor 202 and the N-doped region 203B. In another embodiment, an assisting layer having an N-doped region 203B on top of the P-doped region 203A can have a continuous layout. In an alternative embodiment, an assisting layer having a P-doped region 203A can have a non-continuous layout.

In one embodiment, the highly resistive P-doped substrate 201 has a resistance of between 100 and 150 ohm. The doping concentration of the N-well 204 is lower than the P-doped region 203A. For example, the doping concentration of the N-well 204 can be from $2.5 \times 10^{12}$ to $2.8 \times 10^{12}/cm^2$, and that of the P-doped region 203A can be from $7 \times 10^{12}$ to $8 \times 10^{12}/cm^2$. The doping concentration of the N-doped region 203B is about the range of from $1 \times 10^{12}$ to $3 \times 10^{12}/cm^2$, which is lower than the doping concentration of the P-doped region 203A.

The materials suitable for the insulating layer 205 and the resistor 202 shown in FIG. 4 of the structure 200B can be identical to the structure 200A described previously.

In FIG. 4, the range of a depletion region 210B is defined by dotted lines. Compared to a structure without an N-doped region 203B, the depletion region 210B in the structure 200B is more extended, therefore creating a greater space charge region and the intensity of the electric field can be effectively reduced in the structure 200B.

Figure 5:
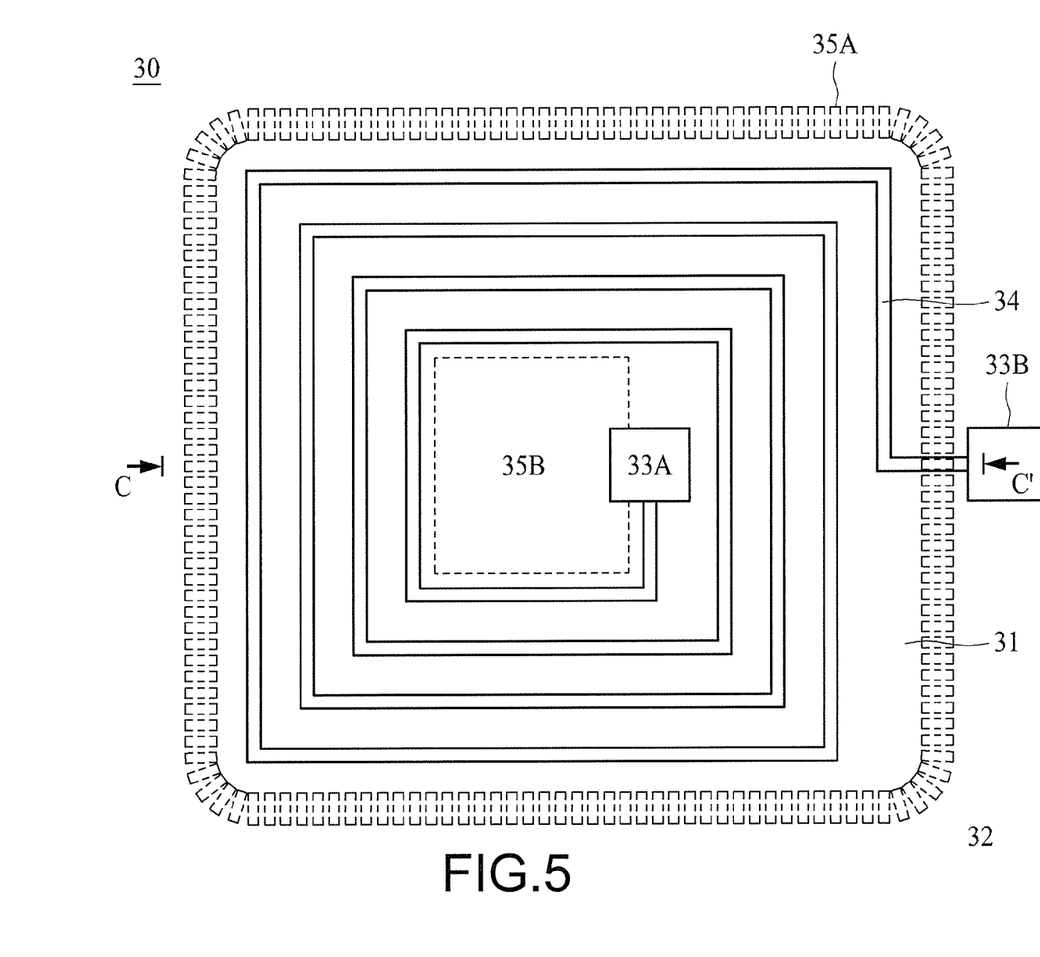
FIG. 5 depicts a top view of a semiconductor structure with a high voltage area and a low voltage area according to one embodiment of the present invention, wherein the dotted lines represent a buried portion of the structure.

FIG. 5 depicts a top view of a semiconductor structure 30 with a high voltage area 31 and a low voltage area 32 according to one embodiment of the present invention, wherein the dotted lines represent a portion buried in the substrate of the semiconductor structure 30. The input pad 33A, the output pad 33B, and the original portion of the assisting layer 35A shown in FIG. 5 can be similar structures as shown in FIGS. 1 and 3; however, the resistor 34 in the structure 30 surrounds the input pad 33A, and an additional portion of the assisting layer 35B is positioned within the original portion of the assisting layer 35A.

Figure 6:
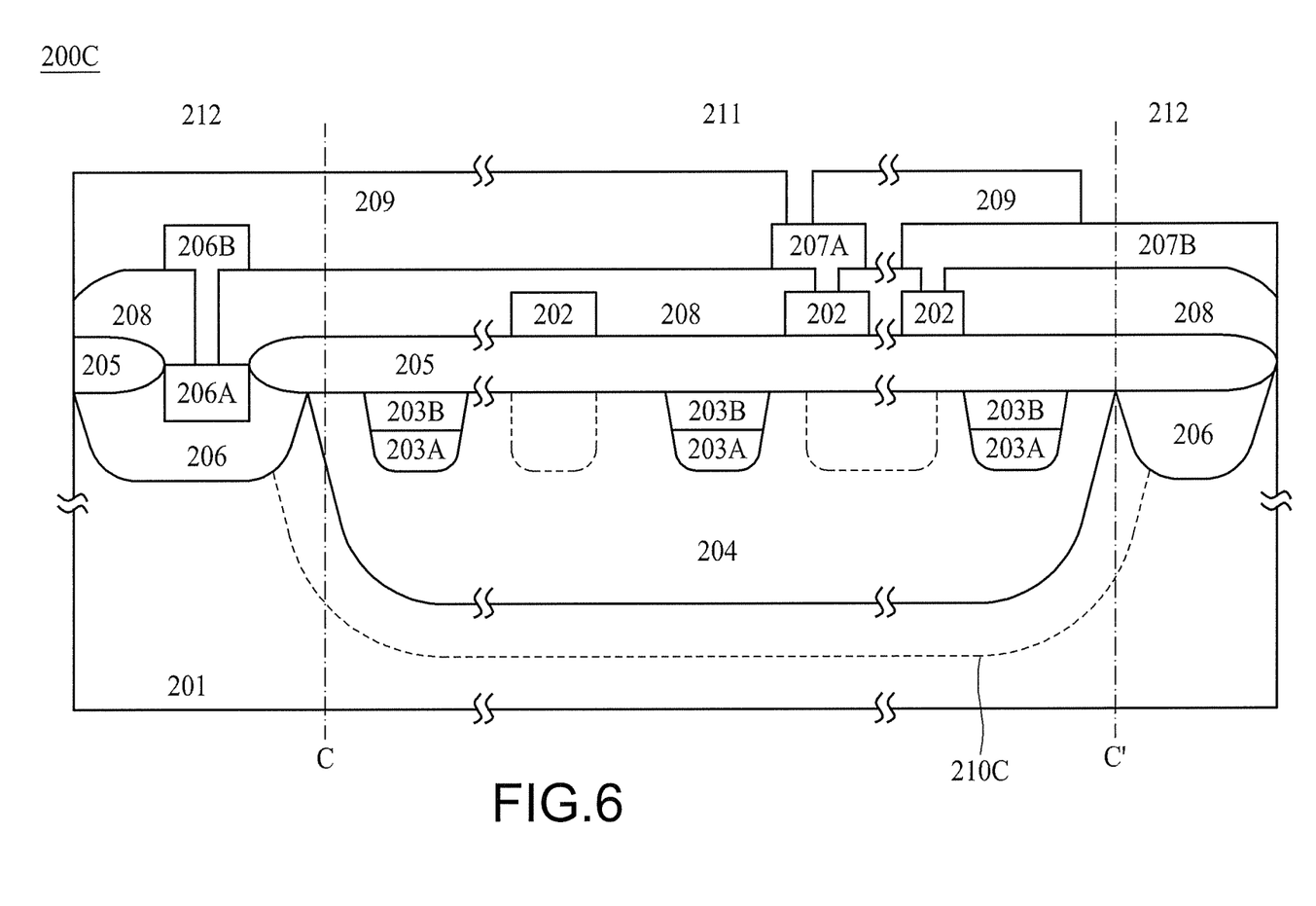
FIG. 6 depicts a cross-sectional view along line CC' shown in FIG. 5 according to another embodiment of the present invention.

FIG. 6 depicts a cross-sectional view along line CC' shown in FIG. 5 according to another embodiment of the present invention. The doping profile of the assisting layer 35 shown in FIG. 6 can be similar to the one shown in FIG. 2 or FIG. 4. The semiconductor structure 200C shares a similar structure with the structure 200A in FIG. 2 and the structure 200B in FIG. 4, except for the different arrangement of the resistor 202, the input pad 207A, the output pad 207B, and an additional portion of an assigning layer in the center of the high voltage area 211. In the present embodiment, the original portion of the assisting layer separating the high voltage area 211 from the low voltage area 212 includes a P-doped layer 203A and an N-doped layer 203B; the additional portion of the assisting layer includes only a P-doped layer 203A and an N-doped layer 203B. In another embodiment, the additional portion of the assisting layer includes only a P-doped layer 203A.

In FIG. 6, the range of a depletion region 210C is defined by dotted lines. Compared to a structure without an additional portion of the assisting layer, the depletion region 210C in the structure 200C is more extended, therefore creating a greater space charge region and the intensity of the electric field can be effectively reduced in the structure 200C. The original portion and the additional portion of the assisting layer can have either a continuous layout as shown in FIG. 1 or a non-continuous layout as shown in FIG. 3.

Figure 7:
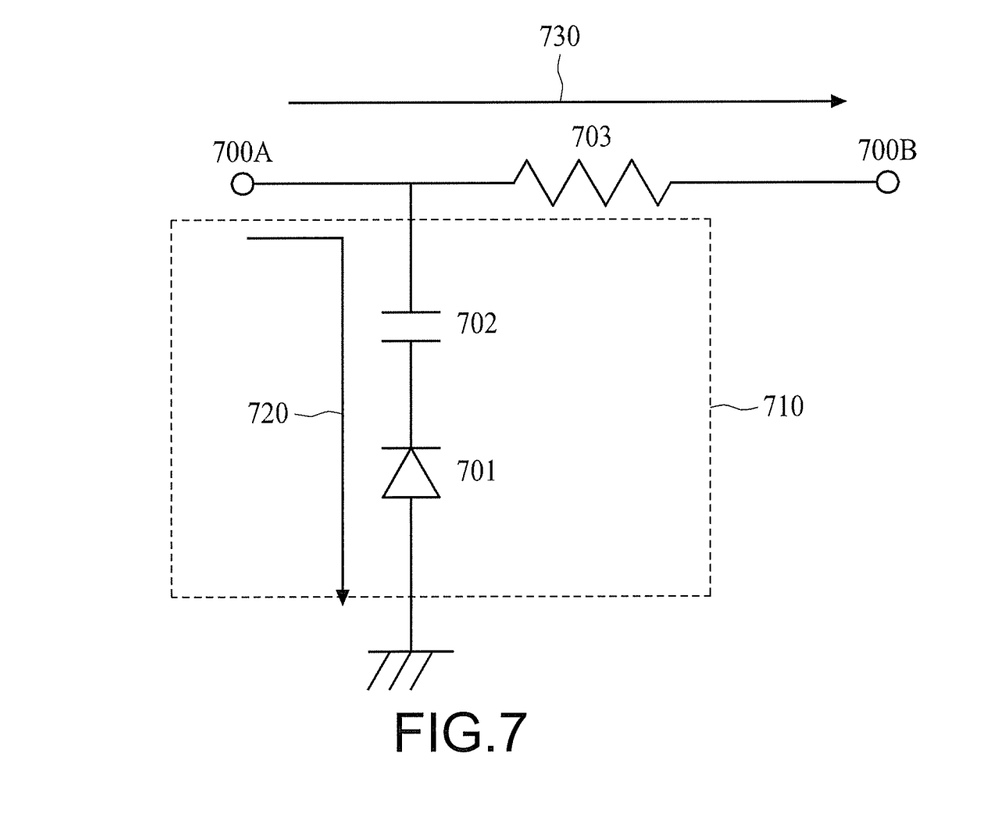
FIG. 7 depicts an equivalent circuit of the semiconductor structure illustrated in FIGS. 2, 4, and 6.

FIG. 7 depicts an equivalent circuit of the semiconductor structure illustrated in FIGS. 2, 4, and 6. The input 700A and the output 700B shown in FIG. 7 represent the input pad and the output pad of the above-mentioned semiconductor structures. A resistor 703 electrically connects the input 700A and the output 700B. A guard region 710 includes a capacitor 702 and a diode device 701 connected in series. A first end of the diode device 701 is grounded and a second end of the diode device 701 is connected to a fourth end of the capacitor 702. A third end of the capacitor 702 is connected to the current path between the input 700A and the output 700B. The diode device 701 depicted in FIG. 7 is a symbolic representation, which can include an arrangement of a plurality of diodes connected in series.

Referring back to FIG. 4, when a high voltage lower than the sum of the breakdown voltage of the insulating layer 205 and the breakdown voltage of the diode device is applied to the input pad 207A, the current would follow the path below: from the high voltage input pad 207A, the resistor 202, and finally to the output pad 207B, thereby entering the low voltage area. The voltage level at the output pad 207B is greatly reduced by the resistor 202 configured to consume a sufficient electrical potential before the current enters the low voltage area. In FIG. 7, the current under this normal operation condition follows the path 730. On the other hand, when a high voltage greater than the sum of the breakdown voltage of the insulating layer 205 and the breakdown voltage of the diode device is applied to the input pad 207A, the current would then follow the path below: from the high voltage input pad 207A, the capacitor, the diode device, and finally to the ground. In FIG. 7, the current under this overload voltage protection condition follows the path 720.

Referring back to FIG. 4, the capacitor, in the present embodiment, has an upper electrode made of the resistor 202 and a lower electrode made by a portion of the P-substrate 201. In the embodiment shown in FIG. 4, the lower electrode can be the N-doped region 203B positioned inside the N-well 204. In another embodiment shown in FIG. 2, the lower electrode can be the N-well 204. The diode device, in the present embodiment, includes the assisting layer, the N-well 204, and the P-substrate 201. As shown in FIG. 4, the assisting layer comprises a P-doped region 203A and an N-doped region 203B; therefore, the diode device includes two diodes connected in series. The P-substrate 201 can be further grounded through the connection to the P-well 206.

FIG. 8A to FIG. 8J illustrate manufacturing steps of a method of manufacturing a semiconductor structure with a cross-sectional view illustrated in FIG. 4. The present invention provides two methods for manufacturing the semiconductor structure.

Figure 8A:
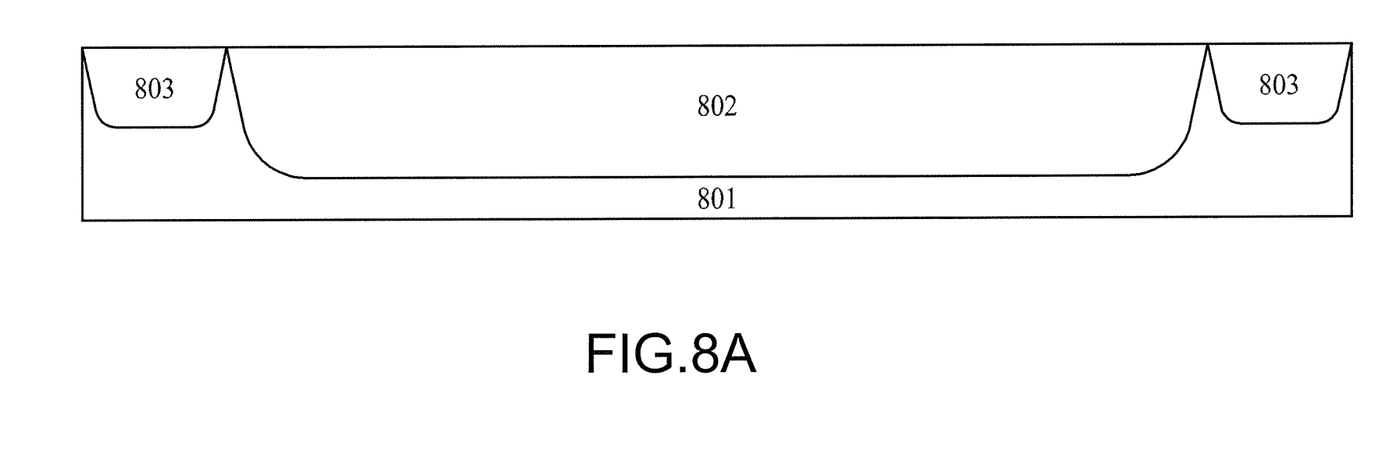

A first method is described in the following. FIG. 8A provides a P-substrate 801 with an N-well 802 and two P-wells 803. The N-well 802 is formed by a first implantation process. FIG. 8B-1 shows a step of depositing a patterned layer of silicon nitride 804 on top of the P-substrate 801 as a hard mask for the subsequent field oxide formation. A patterned photo resist 805 is then formed on the patterned silicon nitride 804. Windows 805A are opened on the photo resist 805 to facilitate a second implantation, and the P-doped region 806 is formed. FIG. 8C-1 shows the formation of the field oxide 807, and the stripping of the silicon nitride 804. In another embodiment, the field oxidation process can be replaced by a shallow trench isolation process. FIG. 8D-1 illustrates the process of resistor 808 deposition and the resistance tuning by a third implantation. FIG. 8E-1 shows the result of the patterned resistor 808. In the present embodiment, poly-silicon is used as a resistor material; however, other conductive materials such as aluminum, copper, silicon carbide, titanium nitride, or the combination thereof can also be used as the resistor. FIG. 8F-1 shows the formation of the ohmic contact at two ends of the resistor 808 by a fourth implantation ($N^+$ ion implantation); said two ends will be electrically connected to an input pad and an output pad, respectively. At the current step, the $N^+$ ion implantation also forms the N-doped region 809 on top of the P-doped region 806 via a process of field implantation.

Figure 8B:
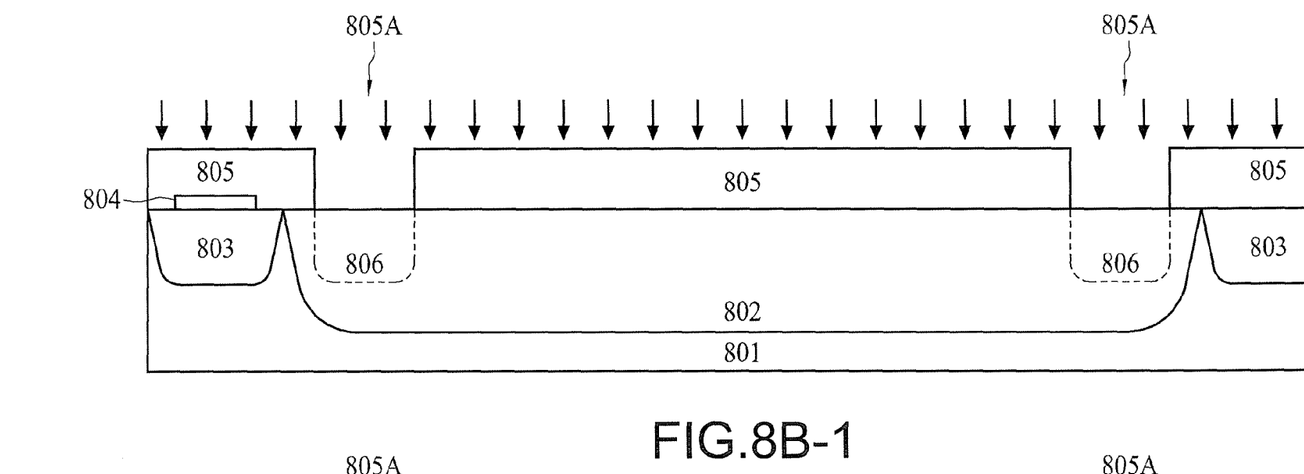
Figure 8B:
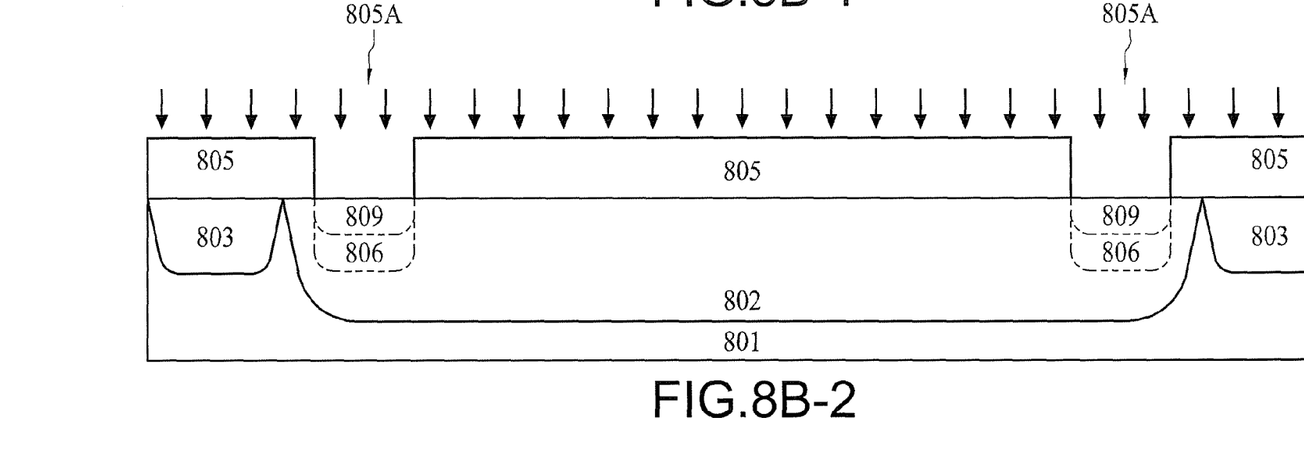
Figure 8C:
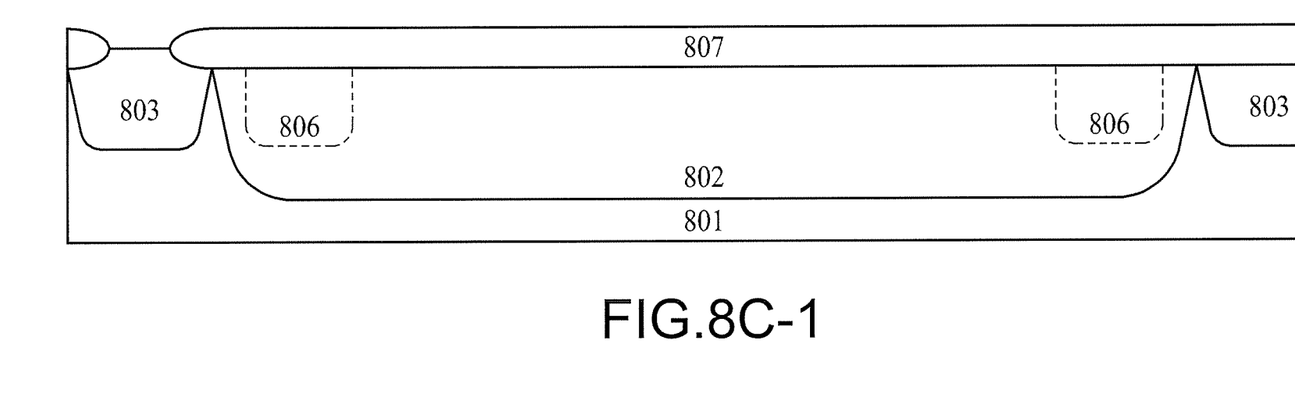
Figure 8C:
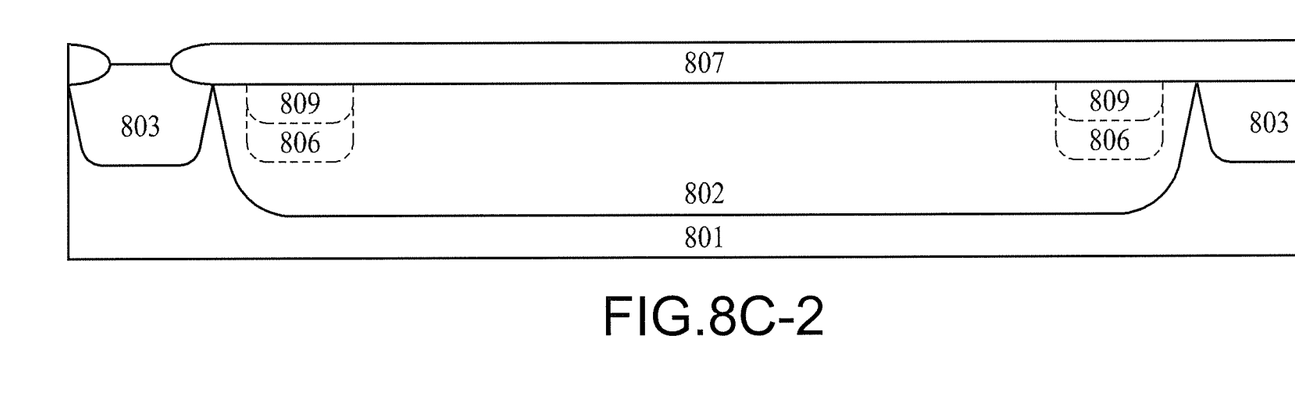
Figure 8D:
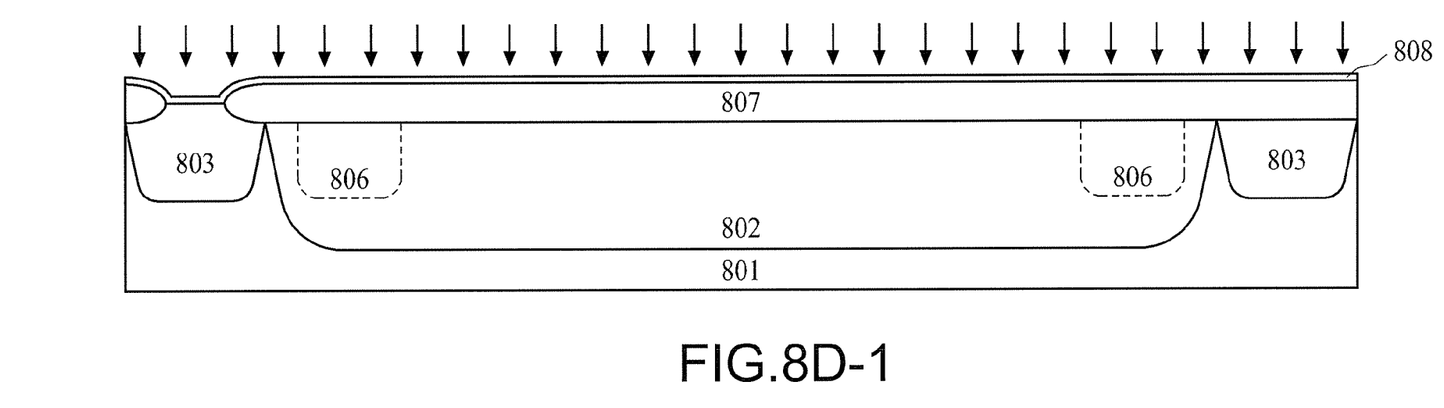
Figure 8D:
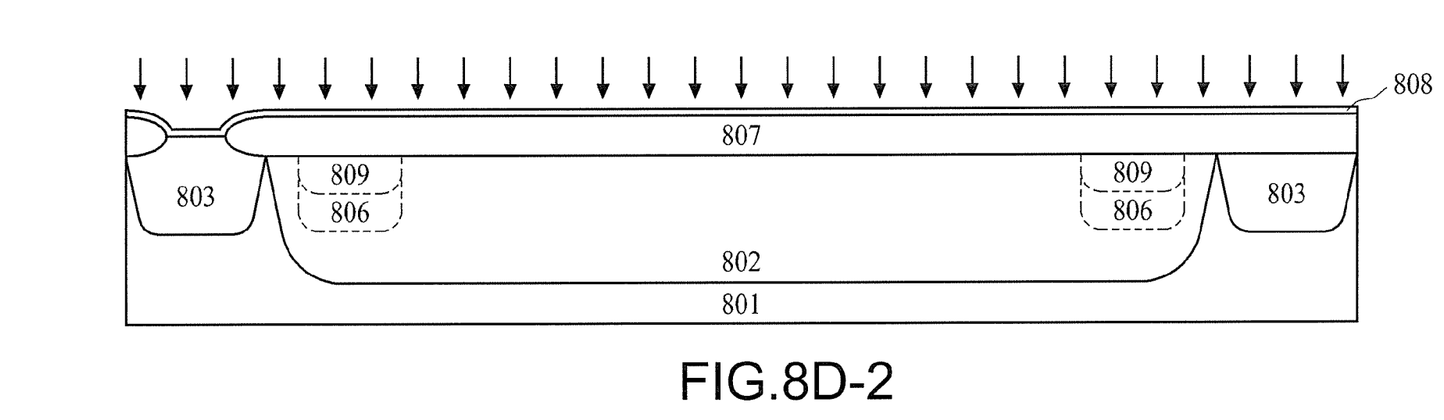
Figure 8E:
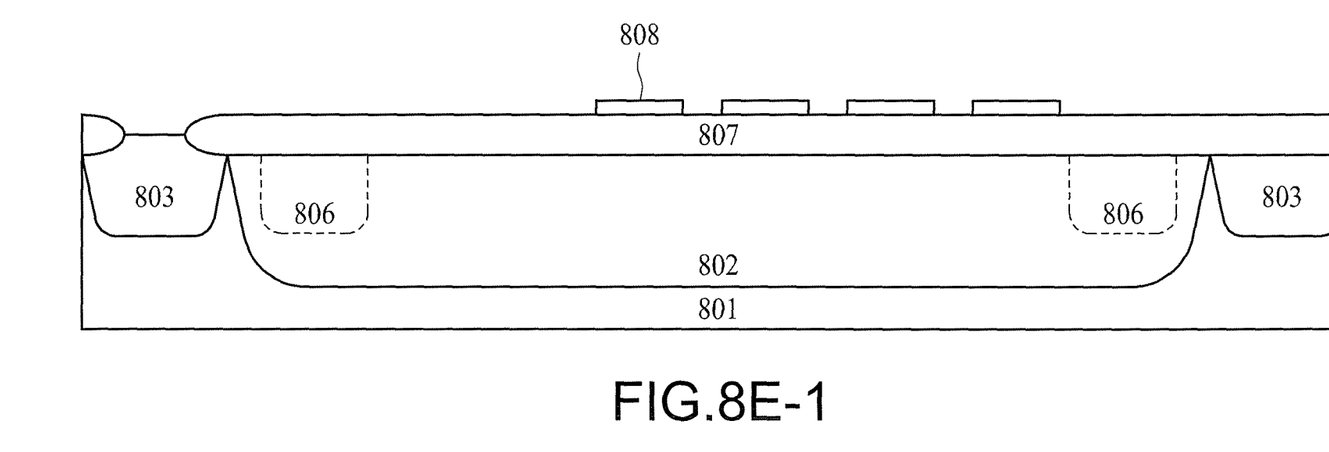
Figure 8E:
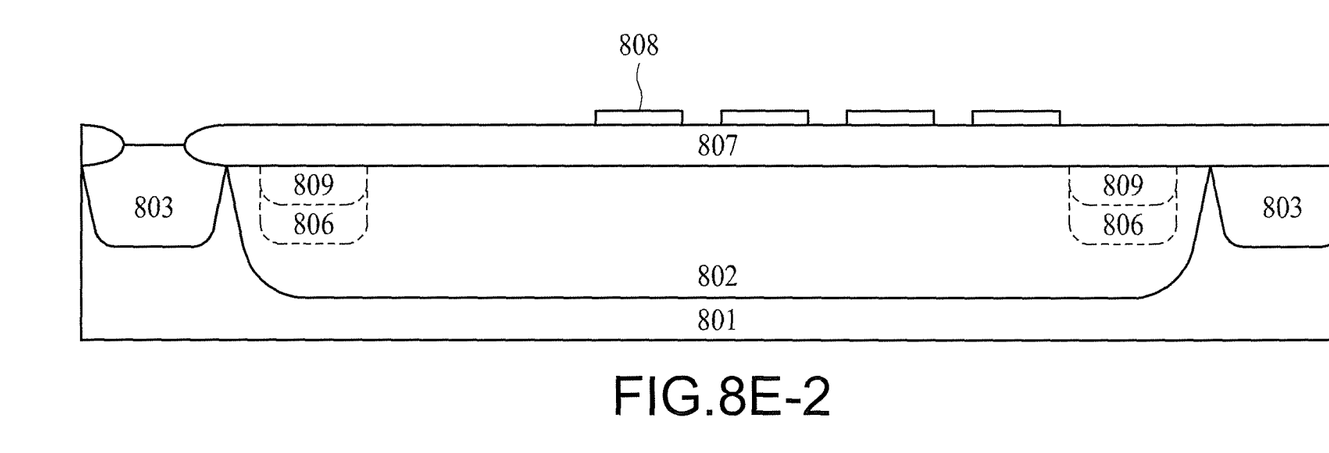
Figure 8F:
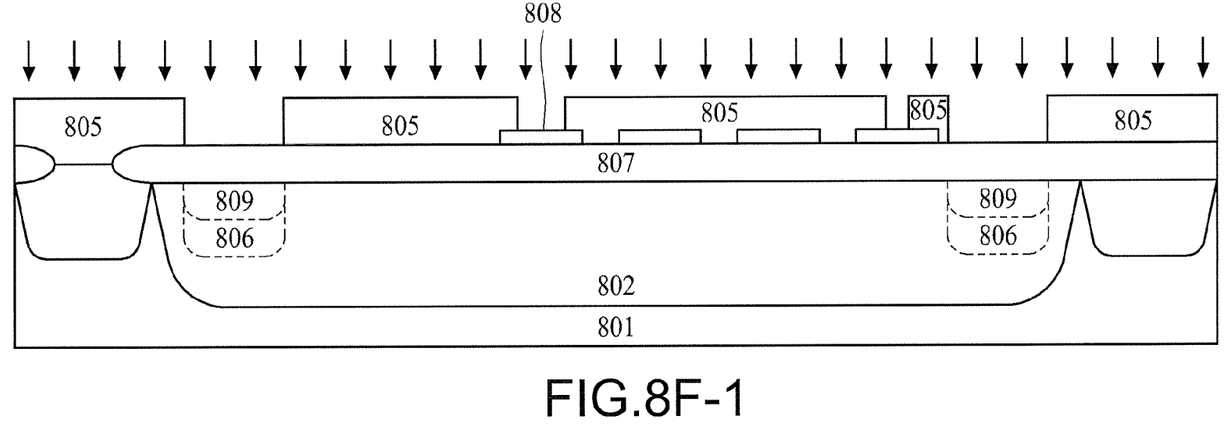
Figure 8F:
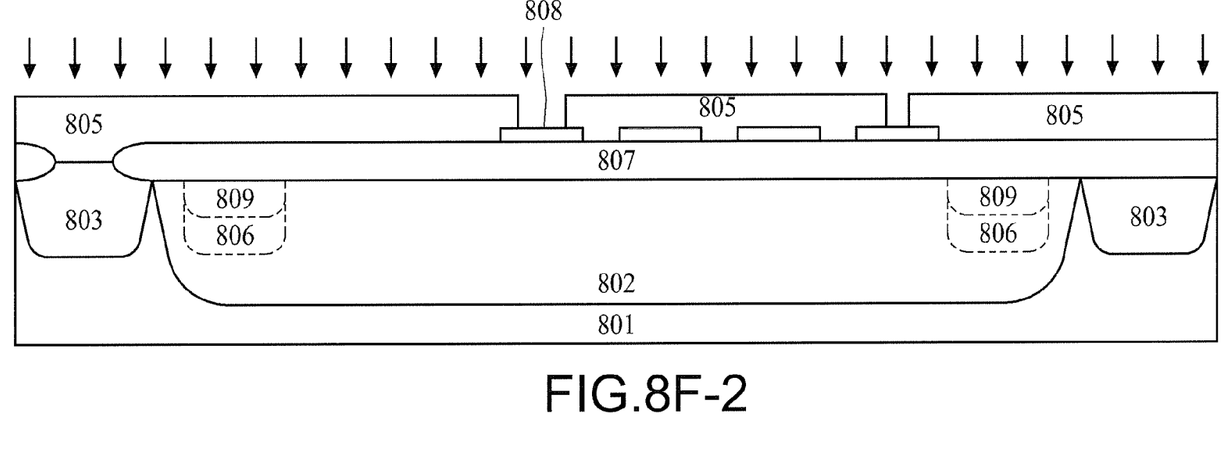
Figure 8G:
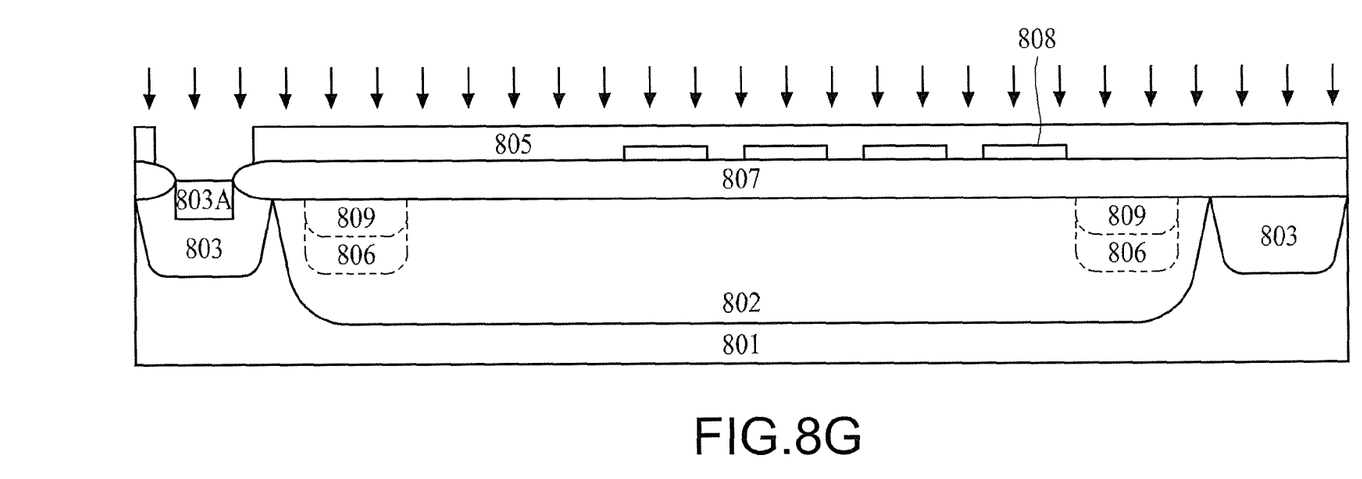
Figure 8H:
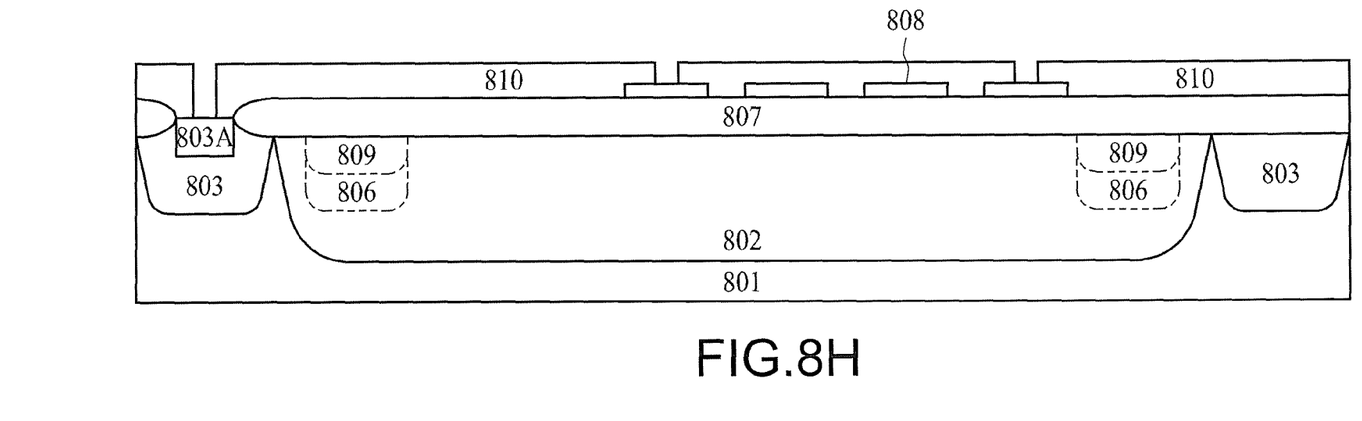
Figure 8I:
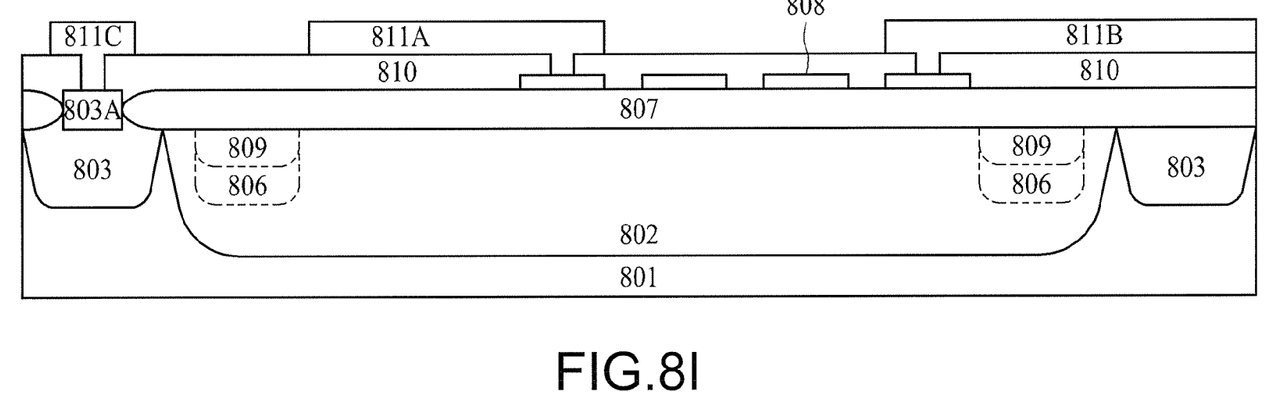
Figure 8J:
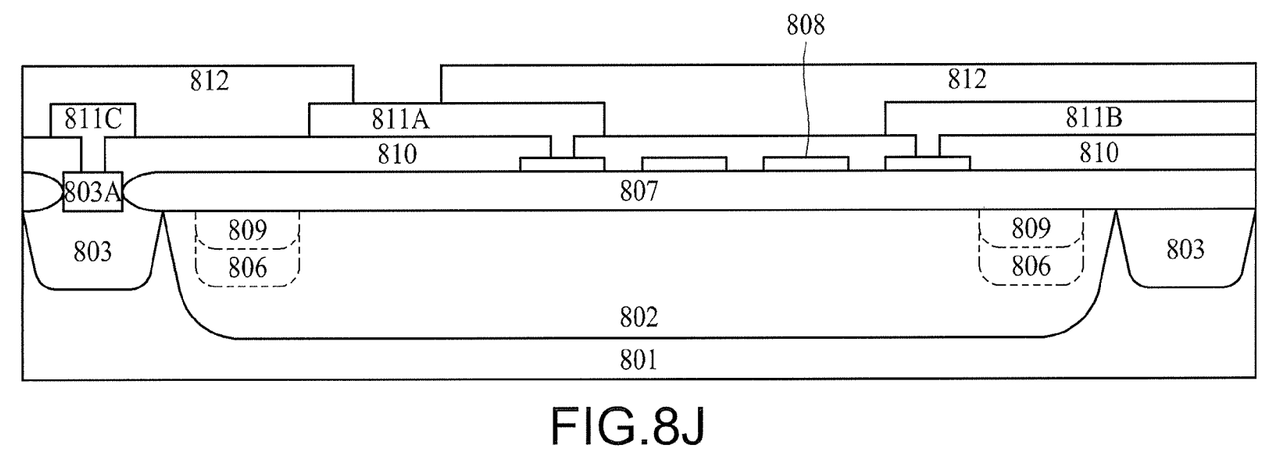

FIG. 8G is a photo step to form an ohmic contact 803A for the P-well 803. FIG. 8H forms an inter-layer dielectric (ILD) 810 on the field oxide 807 and the resistor 808 by a dielectric deposition. The ILD 810 layer is further etched to expose the ohmic contact 803A of the P-well 803 and the ohmic contact of the resistor 808. FIG. 8I forms metal pads 811A, 811B connecting to two ends of the resistor 808 and a metal pad 811C connecting to the P-well 803. FIG. 8J is a final step which deposits a passivation layer 812 having an opening on the metal pad 811A. In one embodiment, the metal pad 811A is the I/O pad of the high voltage integrated circuit.

A second method is described as follows: FIGS. 8A, and 8G to 8J are identical both in the first method and the second method. FIG. 8B-2 forms the assisting layer, namely a P-doped region 806 and an N-doped region 809, via the opening of the photo resist by a second implantation. FIG. 8C-2 forms the field oxide 807 on a silicon nitride mask; the nitride mask is removed at the completion of the oxidation. FIG. 8D-2 illustrates the process of resistor 808 deposition and the resistance tuning by a third implantation. FIG. 8E-2 shows the result of the patterned resistor 808. FIG. 8F-2 shows the formation of the ohmic contact at two ends of the resistor 808 by a fourth implantation ($N^+$ ion implantation); said two ends will be electrically connected to an input pad and an output pad, respectively.

Step 8B-1 and 8B-2 form a P-doped region in the N-well. The P-doped region is considered a portion of the assisting layer, and hence the above-mentioned steps define the high voltage area and the low voltage area of the high voltage integrated circuit.

The methods and features of this invention have been sufficiently described in the above examples and descriptions. It should be understood that any modifications or changes without departing from the spirit of the invention are intended to be covered in the protection scope of the invention.

What is claimed is:

1. A method of manufacturing a semiconductor structure with a high voltage area and a low voltage area, comprising:
    providing a substrate of a first conductivity type;
    forming a second doped region of a second conductivity type in the substrate by a first implantation;
    forming a first doped region of the first conductivity type in the second doped region by a second implantation;
    forming an insulating layer on the substrate;
    forming a resistor on the insulating layer, wherein the resistor electrically connects the high voltage area and the low voltage area; and
    forming a conductor electrically connected to the resistor, wherein at least part of the conductor is located in the high voltage area and another part of the conductor is located in the low voltage area;
    wherein the step of forming the first doped region defines the high voltage area and the low voltage area.

2. The method of manufacturing a semiconductor structure of claim 1, wherein the step of forming a resistor comprises:
    depositing resistor materials on the insulating layer;
    controlling a resistance of the resistor materials by a third implantation;
    patterning the resistor; and
    forming an ohmic contact on a portion of the resistor by a fourth implantation.

3. The method of manufacturing a semiconductor structure of claim 1, further comprising:
    forming a third doped region of the second conductivity type on the first doped region and in the second doped region.

4. The method of manufacturing a semiconductor structure of claim 2, further comprising:
    forming a third doped region of the second conductivity type on the first doped region and in the second doped region concurrently with the step of forming an ohmic contact on a portion of the resistor.

5. The method of manufacturing a semiconductor structure of claim 1, further comprising:
    forming a dielectric layer after the step of forming the resistor on the insulating layer by an inter-layer dielectric deposition, wherein the dielectric layer is etched to expose a portion of the resistor; and
    forming a passivation layer after the step of forming the conductor electrically connected to the resistor, wherein the passivation layer is etched to expose a portion of the conductor.

* * * * *